United States Patent
Furuhata et al.

(10) Patent No.: US 8,330,219 B2
(45) Date of Patent: Dec. 11, 2012

(54) SEMICONDUCTOR DEVICE WITH HIGH-VOLTAGE BREAKDOWN PROTECTION

(75) Inventors: Tomoyuki Furuhata, Suwa (JP); Hideyuki Akanuma, Minowa-machi (JP); Hiroaki Nitta, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 173 days.

(21) Appl. No.: 12/492,082

(22) Filed: Jun. 25, 2009

(65) Prior Publication Data
US 2010/0001345 A1    Jan. 7, 2010

(30) Foreign Application Priority Data
Jul. 3, 2008   (JP) ................. 2008-174352

(51) Int. Cl.
*H01L 29/66* (2006.01)
(52) U.S. Cl. ........ 257/343; 257/367; 257/341; 257/401; 257/357; 257/525; 438/188; 438/199; 438/587; 438/340; 438/236
(58) Field of Classification Search ............... 257/335, 257/162, 165, 423, 556, 557, 575, 288, 401, 257/901, E29.261, 274, 491, 492, 493, 369, 257/371, 511, 525, 213, 202, 367, 368, 343, 257/341, 355, 356, 357, 606; 438/48, 309, 438/325, 316, 335, 204, 236, 188, 199, 207, 438/313, 318, 197, 284, 286, 128, 587, 598, 438/205, 340
See application file for complete search history.

(56) References Cited

U.S. PATENT DOCUMENTS

| | | | |
|---|---|---|---|
| 5,204,541 A * | 4/1993 | Smayling et al. ............. 257/138 |
| 7,115,946 B2 | 10/2006 | Kawaguchi et al. |
| 7,605,428 B2 * | 10/2009 | Williams et al. .............. 257/335 |
| 7,781,834 B2 * | 8/2010 | Wei et al. ...................... 257/343 |
| 2002/0109184 A1 * | 8/2002 | Hower et al. .................. 257/335 |
| 2006/0011975 A1 * | 1/2006 | Yonemoto et al. ............ 257/335 |
| 2006/0086973 A1 * | 4/2006 | Hitani et al. .................. 257/335 |

FOREIGN PATENT DOCUMENTS

| | | |
|---|---|---|
| JP | 05-129425 A | 5/1993 |
| JP | 2002-110970 A | 4/2002 |
| JP | 2004-200359 A | 7/2004 |
| JP | 2006-165056 A | 6/2006 |
| JP | 2006-210532 A | 8/2006 |
| JP | 2007-088334 A | 4/2007 |

* cited by examiner

*Primary Examiner* — Ha Tran T Nguyen
*Assistant Examiner* — Thanh Y Tran
(74) *Attorney, Agent, or Firm* — Kilpatrick Townsend & Stockton LLP

(57) ABSTRACT

A semiconductor device includes: a semiconductor substrate having a first conductivity type; a well having a second conductivity type and provided inside the semiconductor substrate; a first impurity region having the first conductivity type and provided within the well; a second impurity region having the second conductivity type, provided inside the well and away from the first impurity region; and a third impurity region having a first conductivity type, provided surrounding the well and away from the second impurity region. In this semiconductor device, the well is formed to be deeper than the first impurity region, the second impurity region, and the third impurity region, in a thickness direction of the semiconductor substrate; and a minimum distance between the first impurity region and the second impurity region is smaller than a minimum distance between the second impurity region and the third impurity region.

6 Claims, 2 Drawing Sheets

SEMICONDUCTOR DEVICE WITH HIGH-VOLTAGE BREAKDOWN PROTECTION

This application claims priority to Japanese Patent Application No: 2008-174352, filed Jul. 3, 2008, the entire disclosure of which is expressly incorporated by reference herein.

BACKGROUND

1. Technical Field

The present invention relates to a semiconductor device.

2. Related Art

High breakdown voltage metal oxide semiconductors (MOS) which operate in high speed are in demand for improving the performance of semiconductor devices. Examples of suggested MOS devices with such features include lateral diffused MOS (LDMOS) and offset MOS having offset gates or drains.

Such MOS devices include, for instance, a P-type substrate, deep N-type wells formed therein, and P-type shallow impurity regions formed inside the N-type wells. Field-effect transistors (FET) are formed using these shallow impurity regions. These MOS devices are driven in higher voltages compared to common low-voltage transistors. Hereafter, these MOS devices may also be referred to as high voltage MOS (HVMOS) devices.

Since a relatively high operating voltage (approximately 30V or more) is input into the HVMOS for its operation, deviation of operating voltage may cause a negative effect on other low-voltage elements formed in the same substrate. For instance, JP-A-5-129425 discloses a semiconductor device that reduces malfunctions of the low-voltage elements caused by a noise or a fluctuation of a voltage which is input into the high-voltage elements formed on the same substrate as the low-voltage elements. This semiconductor device includes a well formed in the substrate, another well formed inside that well, and the low-voltage elements formed inside the second well. The first well has an opposite conductivity type as that of the substrate, and the second well has the same conductivity type as that of the substrate.

However, protecting the low-voltage elements from the noise and the fluctuation of a high-voltage does not sufficiently reduce the deviation of a substrate potential, and therefore a reliable operation of semiconductor device is not necessarily achieved. Moreover, the high-voltage operation of the HVMOS causes the breakdowns in element isolation structures. These breakdowns generate deviation of the substrate potential, and may damage not only the low-voltage elements but also other elements formed on the semiconductor substrate.

SUMMARY

An advantage of the invention is to provide a semiconductor device that minimizes the damage of non-high-voltage elements when the breakdown occurs in high-voltage elements.

According to an aspect of the invention, the semiconductor device includes: a semiconductor substrate having a first conductivity type; a well having a second conductivity type and provided inside the semiconductor substrate; a first impurity region having the first conductivity type and provided within the well; a second impurity region having the second conductivity type, provided inside the well and away from the first impurity region; and a third impurity region having a first conductivity type, provided surrounding the well and away from the second impurity region. In this semiconductor device, the well is formed to be deeper than the first impurity region, the second impurity region, and the third impurity region, in a thickness direction of the semiconductor substrate. Moreover, a minimum distance between the first impurity region and the second impurity region is smaller than a minimum distance between the second impurity region and the third impurity region.

In this semiconductor device, the breakdown of the high-voltage element occurs therein. This minimizes the effect of the breakdown on other elements formed on the semiconductor substrate.

In this case, the first impurity region may constitute a body region of an LDMOS.

At the same time, the first impurity region may constitute a drift region of an offset drain MOS.

Moreover, at least part of a periphery of the second impurity region may exist outside a periphery of the well.

In this case, the well may be formed by a drive-in diffusion method, and the first, the second, and the third impurity regions may be retrograde wells formed by a high-energy ion implantation method.

DESCRIPTION OF EXEMPLARY EMBODIMENT

An embodiment of the invention will now be described with references to the accompanying drawings. The embodiment which will be described hereafter represent one example of the invention.

Figure 1:
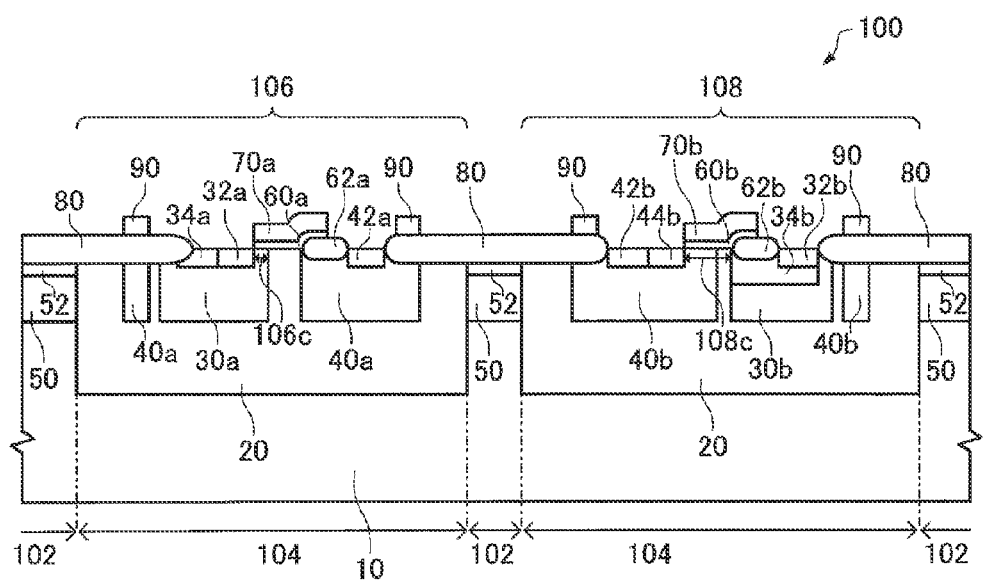
FIG. 1 is a sectional view schematically illustrating a semiconductor device 100 according to an embodiment.
Figure 2:
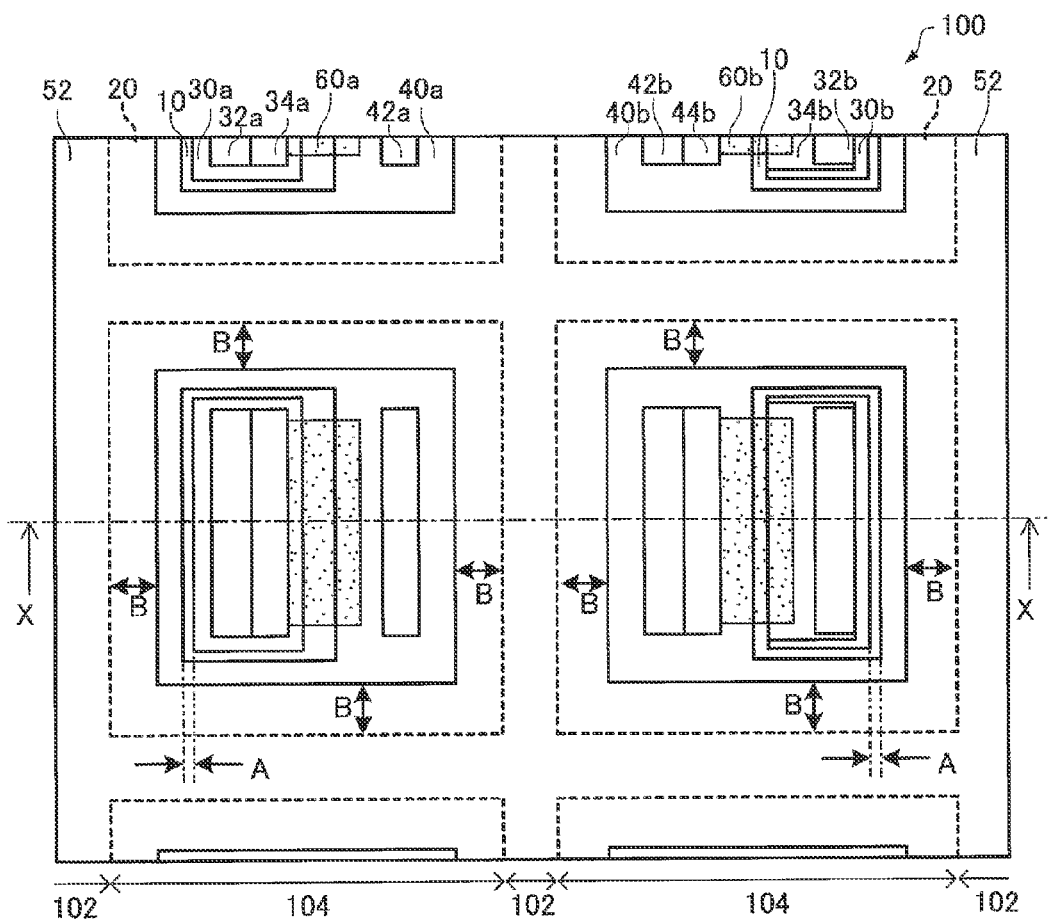
FIG. 2 is a plan view schematically illustrating the semiconductor device 100 according to the embodiment.
Figure 3:
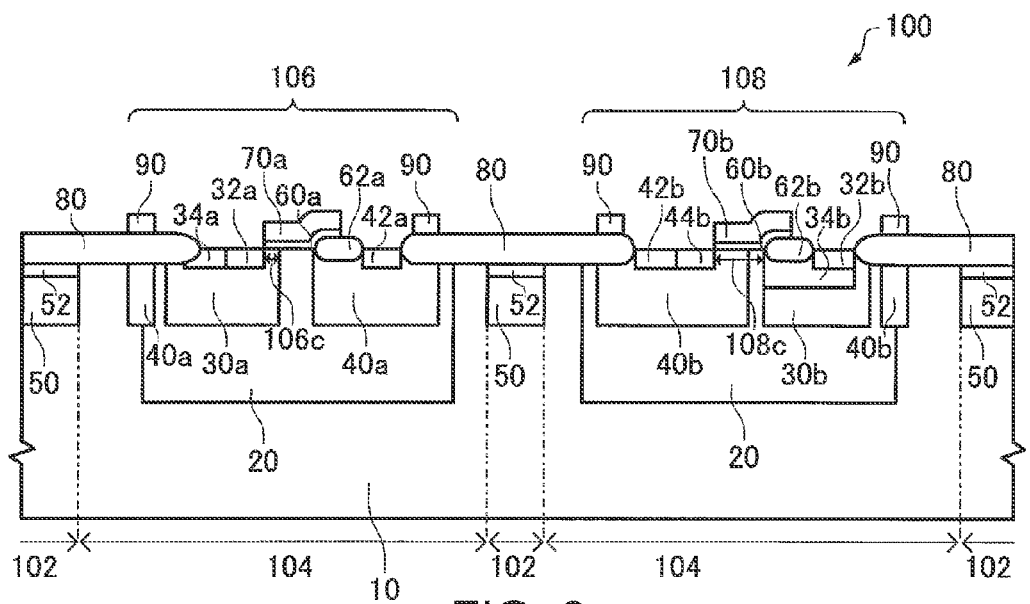
FIG. 3 is a sectional view schematically illustrating the semiconductor device 100 according to the embodiment.
Figure 4:
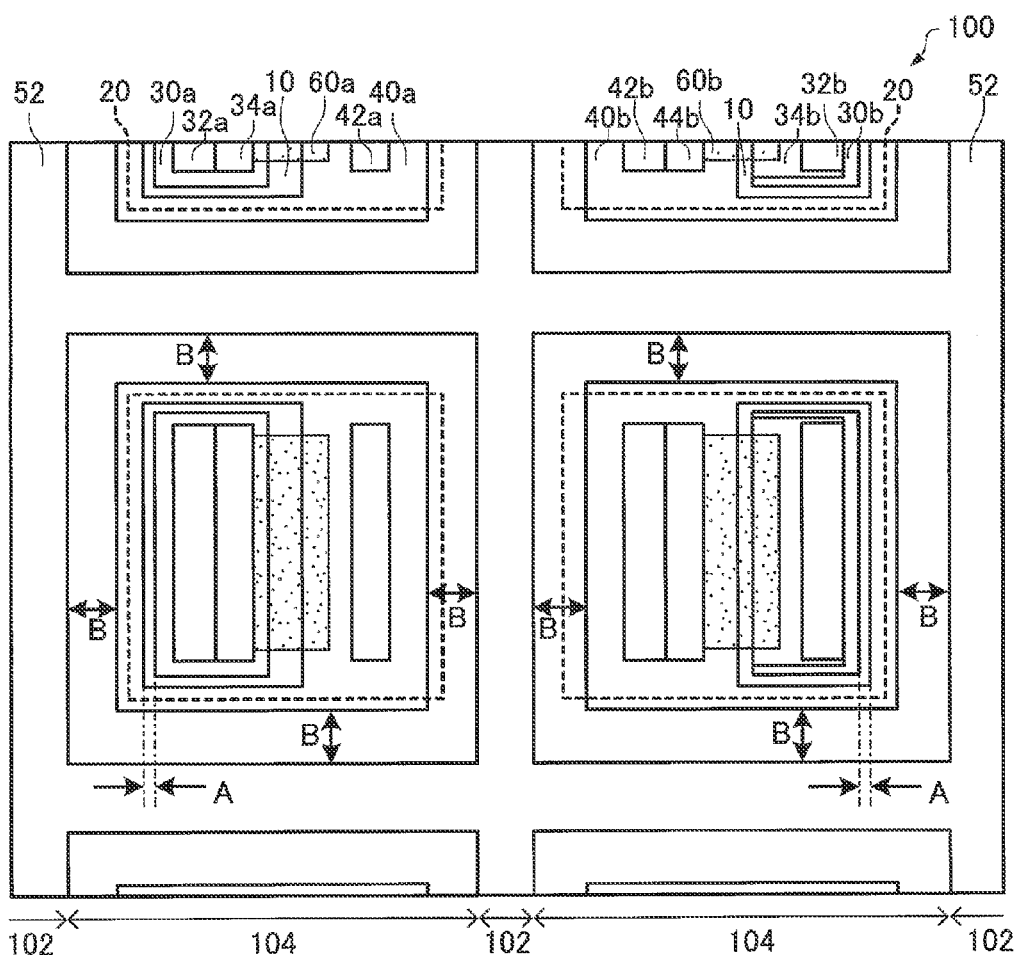
FIG. 4 is a plan view schematically illustrating the semiconductor device 100 according to the embodiment.

FIG. 1 is a sectional view schematically illustrating main parts of the semiconductor device 100 according to the embodiment. FIG. 2 is a plan view schematically illustrating the main parts of the semiconductor device 100 according to the embodiment. FIG. 1 illustrates a section along a line X-X in FIG. 2. Moreover, illustrations of a gate electrode 70, an element isolation insulating layer 80 and a conductive layer 90 are omitted in FIG. 2. FIG. 3 is a sectional view schematically illustrating the main parts of the semiconductor device 100 according to the embodiment. FIG. 4 is a plan view schematically illustrating the main parts of the semiconductor device 100 according to the embodiment.

The semiconductor device 100 according to the embodiment includes, as shown in FIG. 1, a P-type semiconductor substrate 10, an N-type well 20, a P-type first impurity region 30, an N-type second impurity region 40, and a P-type third impurity region 50. In this embodiment, the description refers to the first conductivity type as P-type, and the second conductivity type as N-type.

The semiconductor device 100 includes an element isolation region 102, and an element region 104 partitioned by the element isolation region 102. The element region 104 may be formed either in singular or in a plurality. In this embodiment, an example refers to the forming of any one of an LDMOS 106 and an offset drain MOS 108 in the element region 104. In this case, the element region 104 is provided in plurality.

Other low-voltage elements such as CMOS devices may also be formed in the element regions 104. In this embodiment, the LDMOS 106 has an N-type channel, and the offset drain MOS 108 has a P-type channel.

The semiconductor substrate 10 is made of, for instance, a silicon substrate. The semiconductor substrate 10 in this embodiment has P-type conductivity.

A well 20 is formed in each of the element regions 104 of the semiconductor substrate 10. The well 20 in this embodiment has N-type conductivity. The well 20 is formed to have a greater depth than other impurity regions (described later) in a thickness direction of the semiconductor substrate 10. The well 20 has a lower impurity concentration compared to that of the N-type second impurity region 40 which will be described later. The well 20 is formed inside each of the element regions 104 in plan view. The periphery of the well 20 may either be in contact with or not in contact with the element isolation region 102. The well 20 in the example illustrated in FIGS. 1 and 2 has a rectangular shape in plan view. The periphery drawn in a dotted line in FIG. 2 contacts the element isolation region 102. The well 20 in the example illustrated in FIGS. 3 and 4 does not contact the element isolation region 102. The dotted line in FIG. 4 indicates the periphery of the well 20. The well 20 has a functionality to electrically isolate the MOS formed on each of the element regions 104 from the substrate. The well 20 becomes one of the components that constitute the MOS formed on the element regions 104. For instance, in the LDMOS 106 formed in one of the element regions 104, the well 20 becomes part of a drain of the LDMOS 106, and in the offset drain MOS 108 formed in one of the element regions 104, the well 20 forms a gate (channel) of the offset drain MOS 108. The well 20 is formed by drive-in diffusion. During the drive-in diffusion, the heat carries out impurity diffusion after N-type impurity implantation. This facilitates providing the depth of the well 20. The well 20 may also be formed by high-energy ion implantation (the details will be described later). This method allows for forming the well 20 deep as well as increasing the precision of its shape in a direction orthogonal to a thickness direction of the semiconductor substrate 10.

The first impurity region 30 is formed inside the well 20 of each of the element regions 104. In this embodiment, the first impurity region 30 has P-type conductivity.

In the LDMOS 106 formed in one of the element regions 104, part of the first impurity region 30 forms a channel region, thereby constituting a so-called body region (refer to the LDMOS 106 in FIG. 1). In this case, an N-type source region 34a that becomes a source of the LDMOS 106 is formed in a first impurity region 30a. N-type impurities are implanted in the source region 34a in a high concentration. At this time, a region, which is within the first impurity region 30a under a gate oxidation film 60a and between the edges of the source region 34a and the N-type well 20, becomes a channel region 106c. A P-type contact region 32a is formed in the first impurity region 30a. P-type impurities are implanted in the contact region 32a in a high concentration.

The first impurity region 30 of the offset drain MOS 108 formed in one of the element regions 104 constitutes a drain region (refer to the offset drain MOS 108 in FIG. 1). In this case, part of or all of a first impurity region 30b becomes the drain region. Moreover, an area under a gate oxidation film 60b, between the edges of the first impurity region 30b and a P-type source region 44b, in the well 20 and a second impurity region 40b (described later), becomes a channel region 108c. A P-type contact region 32b is formed in the first impurity region 30b. P-type impurities are implanted in the contact region 32b in a high concentration. Moreover, a P-type offset region 34b is formed in the first impurity region 30b, in order to improve the conductivity of the drain region. P-type impurities are implanted in the offset region 34b in a high concentration, and the impurity concentration is equal to or lower than that of the contact region 32b.

The first impurity region 30 is a retrograde well formed by the high-energy ion implantation. Consequently, the first impurity region 30 is formed without thermal diffusion. This facilitates the shape control of the first impurity region 30 in the direction orthogonal to the thickness direction of the semiconductor substrate 10, and allows for forming the LDMOS 106 and the offset drain MOS 108 to have desired channel lengths in high precision.

The second impurity region 40 is formed in the well 20 in one of the element regions 104, around and away from the perimeter of the first impurity region 30. Here, at least part of the second impurity region 40 is positioned in the well 20. This allows for reducing the length of the well 20 that secures a punch-through breakdown voltage, in a direction orthogonal to the thickness direction of the semiconductor substrate 10. Consequently, it is possible to reduce a planar area of, for instance, the LDMOS 106 and the offset drain MOS (hereafter also referred to as EDMOS) 108 formed the element regions 104. Moreover, this allows for increasing the level of integration of the semiconductor device 100 that includes a plurality of MOS devices formed therein. Further, the second impurity region 40 also functions as a channel stopper.

The second impurity region 40 is formed away from the first impurity region 30 in plan view. In this embodiment, the second impurity region 40 has N-type conductivity. As shown in FIGS. 2 and 4, a distance A between the second impurity region 40 and the first impurity region 30 indicates the closest distance between these regions in plan view.

The second impurity region 40 forms a drain region of the LDMOS 106 formed in one of the element regions 104 (refer to the LDMOS 106 in FIG. 1), thereby constituting a so-called drift region. Here, the contact region 42a is formed in a second impurity region 40a. N-type impurities are implanted in the contact region 42a in a high concentration.

Referring to the offset drain MOS 108 in FIG. 1, the second impurity region 40 of the offset drain MOS 108 in one of the element regions 104 constitutes part of a gate (channel region 108c). The P-type source region 44b which serves as a source of the offset drain MOS 108 is formed in the second impurity region 40b. P-type impurities are implanted in the source region 44b in a high concentration. An N-type contact region 42b is formed in the second impurity region 40b. N-type impurities are implanted in the contact region 42b in a high concentration.

The second impurity region 40 is, similar to the first impurity region 30, a retrograde well formed by the high-energy ion implantation. Consequently, the first impurity region 40 is formed without thermal diffusion. This facilitates the shape control of the first impurity region 30 in the direction orthogonal to the thickness direction of the semiconductor substrate 10, and allows for forming the LDMOS 106 and the offset drain MOS 108 to have desired channel lengths in high precision.

Here, the second impurity region 40 which is formed in any one of the LDMOS 106 and the offset drain MOS 108 is the retrograde well formed by the high-energy ion implantation. In this case, adjusting the concentration profile of the retrograde in a depth direction provides the second impurity region 40 with functionalities such as a channel stopper under a drain-side offset insulating layer 62, a threshold adjustment in each MOS transistor, and a reduction of punch-through effects. Moreover, employing the retrograde well does not suppress the resistance in the second impurity region 40 more than necessary at the surface side, thereby ensuring the breakdown voltage of each MOS transistor. Further, employing the retrograde well provides the second impurity region 40 with a function of reducing the resistance of each MOS transistor during its operation. In other words, forming the second impurity region 40 to be the retrograde well secures the breakdown voltage in a shallow area and reduces the resistance of a deep area during the MOS operation. That is to say, adjusting the concentration profile of the retrograde in the depth direction allows for adjusting the balance between the breakdown voltage and the resistance during operation of MOS transistors.

As shown in FIGS. 1 and 2, the entire second impurity region 40 may be formed inside the well 20. Alternatively, as shown in FIGS. 3 and 4, the periphery of the second impurity region 40 may exist outside the periphery of the well 20. Here, either part of or an entire periphery of the second impurity region 40 may be outside the periphery of the well 20. FIGS. 3 and 4 illustrate an example of the second impurity region 40 in which the periphery thereof (three sides in the periphery of the second impurity region 40) exists outside the periphery of the well 20, in the area in which the first impurity region 30 gets close to the element isolation region 102.

The third impurity region 50 is formed around the well 20, and away from the second impurity region 40. In the illustrated embodiment, the third impurity region 50 surrounds the well 20. As used herein, the term "surround" should be understood to mean "to be all around or on all sides of." The third impurity region 50 is formed inside the element isolation region 102. In this embodiment, the third impurity region 50 has P-type conductivity. The third impurity region 50 may either be in contact with or not in contact with the well 20. Moreover, a P-type contact region 52 is formed in the third impurity region 50. P-type impurities are implanted in the contact region 52 in a high concentration, so that the potential of the contact region 52 becomes the same as that of the P-type semiconductor substrate 10. Similar to the first impurity region 30 and the second impurity region 40, the third impurity region 50 is the retrograde well formed by the high-energy ion implantation.

A distance B between the third impurity region 50 and the second impurity region 40 indicates the closest distance in an area between these regions in plan view. The third impurity region 50 in the examples illustrated in FIGS. 2 and 4 is formed around the second impurity region 40 at a constant distance therefrom.

The LDMOS 106 is formed in one of the element regions 104. The N-type source region 34a constitutes the source of the n-channel LDMOS 106 as shown in FIGS. 1 and 3. The N-type well 20, the N-type second impurity region 40a, and, as needed, the N-type contact region 42a constitute the drain of the LDMOS 106. The P-type first impurity region 30a and, as needed, the P-type contact region 32a constitute the gate of the LDMOS 106. Moreover, the LDMOS 106 includes the gate oxidation film 60a, a gate electrode 70a, and, as needed, a drain-side offset insulating layer 62a. The N-type second impurity region 40a is formed away from and around the perimeter of the first impurity region 30a in plan view. The element isolation insulating layer 80 is formed around the LDMOS 106. Structures of components not explained above will now be described.

The gate oxidation film 60a can be formed on the P-type first impurity region 30a, the N-type well 20, and the drain-side offset insulating layer 62a. The gate oxidation film 60a is made of, for instance, silicon oxide. The gate electrode 70a is formed on the gate oxidation film 60a. The gate electrode 70a is made of, for instance, polysilicon.

The drain-side offset insulating layer 62a is formed in the second impurity region 40a. The gate oxidation film 60a (hereafter also referred to as "gate insulating film 60a") and the gate electrode 70a are formed on the drain-side offset insulating layer 62a. In other words, the gate of the LDMOS 106 is offset at the drain side. This provides the LDMOS 106 with a high breakdown voltage. Examples of the drain-side offset insulating layer 62a include a local oxidation of silicon (LOCOS) layer, a semi-recessed LOCOS layer, and a trench insulating layer. In the examples shown in the drawings, the drain-side offset insulating layer 62a is illustrated as the LOCOS layer.

The element isolation insulating layer 80 is formed in order to isolate the MOS transistor from other elements. The element isolation insulating layer 80 is formed on the semiconductor substrate 10, around each of the element regions 104 and over the element isolation region 102. Examples of the element isolation insulating layer 80 include a LOCOS layer and a semi-recessed LOCOS layer. In the examples shown in the drawings, the element isolation insulating layer 80 is illustrated as a LOCOS layer.

The conductive layer 90 is formed on the element isolation insulating layer 80. The conductive layer 90 is made of, for instance, polysilicon. The conductive layer 90 can, for instance, prevent the inversion of the conductivity type of wells under the element isolation insulating layer 80. In the semiconductor device 100, the conductive layer 90 is formed so as to overlap with the N-type second impurity region 40 which is under the element isolation insulating layer 80 in plan view. Moreover, the second impurity region 40 and the conductive layer 90 are electrically connected so that the potential of the conductive layer 90 becomes the same as that of the first impurity region 30. This increases the performance of the second impurity region 40 as a channel stopper.

The offset drain MOS 108 is formed in one of the element regions 104. The P-type source region 44b constitute the source of the p-channel offset drain MOS 108 as shown in FIGS. 1 and 3. The P-type first impurity region 30b, and, as needed, the P-type contact region 32b and the P-type offset region 34b constitute the drain of the offset drain MOS 108. The N-type second impurity region 40b and the well 20 constitute the gate of the offset drain MOS 108. Moreover, the offset drain MOS 108 includes the gate oxidation film 60b, a gate electrode 70b, and, as needed, a drain-side offset insulating layer 62b. The N-type second impurity region 40b is formed away from and around the perimeter of the first impurity region 30b in plan view. The element isolation insulating layer 80 is formed around the offset drain MOS 108. Structures of the offset drain MOS 108 that are not similar to the previously-recited LDMOS 106 will now be described.

The gate oxidation film 60b can be formed on the N-type second impurity region 40b, the N-type well 20, and the drain-side offset insulating layer 62b. The gate electrode 70b is formed on the gate oxidation film 60b. Materials of the gate oxidation film 60b and the gate electrode 70a are the same as that of the LDMOS 106.

The drain-side offset insulating layer 62b is formed in the first impurity region 30b. The gate oxidation film 60b (hereafter also referred to as "gate insulating film 60b") and the gate electrode 70b are formed on the drain-side offset insulating layer 62b. In other words, the gate of the offset drain MOS 108 is offset at the drain side. This provides the offset drain MOS 108 with a high breakdown voltage. Examples of the drain-side offset insulating layer 62b includes a LOCOS layer and a semi-recessed LOCOS layer. In the examples shown in the drawings, the drain-side offset insulating layer 62b is illustrated as the LOCOS layer. The structure of the element isolation insulating layer 80 is the same as that of the LDMOS 106.

The offset region 34b can be formed inside the second impurity region 30b, under the drain-side offset insulating layer 62b. The impurity concentration of the P-type offset region 34b can be adjusted to a range that allows a current to flow under the drain-side offset insulating layer 62b, while securing the breakdown voltage of the offset drain MOS 108.

As shown in FIGS. 1 and 4, the semiconductor device 100 has a plurality of element regions 104. The LDMOS 106, the EDMOS 108, and other elements are formed in the plurality of element regions 104. These other elements formed in the element regions 104 may also include components such as low-voltage transistors. The LDMOS 106, the EDMOS 108, and other elements are arranged arbitrarily. In the examples shown in the drawings, the element isolation region 102 is a grid arranged among the element regions 104, and the LDMOS 106 and the EDMOS 108 are formed adjacently to each other.

An un-illustrated opening is formed in the element isolation insulating layer 80 formed over the element isolation region 102, so that the potential of the semiconductor substrate 10 is lead through the third impurity region 50. Moreover, the semiconductor device 100 can further include, over the structure shown in FIG. 1, un-illustrated components such as an interlayer insulating film, a protection film, a contact hole, a contact, and a wiring layer.

The semiconductor device 100 is manufactured, for instance, in the following steps.

Initially, the element isolation insulating layer 80 is formed on the P-type semiconductor substrate 10, at the same time as, for instance, forming the drain-side offset insulating layer 62 respectively for the LDMOS 106 and the offset drain MOS 108. The element isolation insulating layer 80 and the drain-side offset insulating layer 62 are formed, for instance, with the LOCOS method.

Thereafter, the N-type well 20 is formed. The well 20 is formed by, for instance, drive-in diffusion. That is to say, N-type impurities are implanted in the semiconductor substrate 10 either a single time or a plurality of times using techniques such as photolithography. Thereafter, the implanted N-type impurities are thermally diffused by heat treatment, thereby forming the well 20. Alternatively, the N-type well 20 may be formed by, for instance, the high-energy ion implantation. The high-energy ion-implantation uses a high acceleration voltage with a range of, for instance, between 1 MeV and 5 MeV. Therefore, the high-energy ion implantation allows for increasing the depth of the impurity implantation without thermal diffusion. Excluding thermal diffusion process allows for increasing the precision of the shape of the well 20 in a direction orthogonal to a thickness direction of the semiconductor substrate 10. Moreover, the well 20 is formed concurrently with the plurality of element regions 104.

Subsequently, the P-type first impurity region 30, the N-type second impurity region 40, and the P-type third impurity region 50 are formed by the high-energy ion implantation. Specifically, impurities for respective conductivity types are implanted in the semiconductor substrate 10 by techniques such as photolithography, so as to form the first impurity region 30, the second impurity region 40, and the third impurity region 50. This implantation is carried out plurality of times, and there is no limitation imposed on the order of implantations. The acceleration voltage during the ion implantations is set to be lower than a voltage during the forming of the well 20. Consequently, the first impurity region 30, the second impurity region 40, and the third impurity region 50 become retrograde wells that have the impurity concentration profile in the depth direction. The high-energy ion implantation, for instance, may also be used for forming the P-type offset region 34b in the offset drain MOS 108.

Subsequently, the gate insulating film 60 is formed. The gate insulating film 60 is formed by, for instance, thermal oxidation. The gate electrode 70 and, if needed, the conductive layer 90 is then formed. The gate electrode 70 and the conductive layer 90 are formed by, for instance, forming the polysilicon layer on the entire surface of the semiconductor substrate 10 followed by patterning.

Thereafter, components such as an interlayer insulating film, a protection film, a contact hole, a contact, and a wiring layer are formed as needed by known methods, and thus the semiconductor device 100 is manufactured.

The semiconductor device 100 according to the embodiment described above has a structure in which the minimum distance (the aforementioned distance A) between the first impurity region 30 and the second impurity region 40 is smaller than the minimum distance (the aforementioned distance B) between the second impurity region 40 and the third impurity region 50. This provides the semiconductor device 100 with the following characteristics.

In the semiconductor device 100, since the distance B is larger than the distance A, the breakdowns of the elements formed in the element regions 104 occurs within those elements. In other words, the places in which the breakdowns occur in the semiconductor device 100 are inside the elements formed in the element regions 104 (between the first impurity region 30 and the second impurity region 40). Therefore, the breakdown is less likely to occur between the semiconductor substrate and the elements (between the second impurity region 40 and the third impurity region 50). As a result, the substrate potential of the semiconductor device 100 is less likely to deviate during the breakdown. Consequently, breakdowns cause minimum effect on other elements formed in the other element regions 104 of the semiconductor substrate 10.

The present invention shall not be limited to the embodiment described above, and may include various modifications. For instance, included within a scope of the invention is a structure substantially the same as those described in the embodiment, such as a structure with the same function, method, and resulting effect as that of the embodiment, and, a structure with the same purpose and the resulting effect. Moreover, the invention also includes, within the scope thereof, a structure with an alternative portion which replaces a portion not essential to the structures described in the embodiment. The invention further includes, within the scope thereof, a structure which exhibits the same effect as the one described in the embodiment, as well as a structure which achieves the same purpose as the ones described in the embodiment. Still further, the invention includes, within the scope thereof, a structure including known techniques applied to the structures described in the embodiment.

What is claimed is:

1. A semiconductor device, comprising:
   a semiconductor substrate having a first conductivity type;
   a well having a second conductivity type and provided inside the semiconductor substrate;
   a first impurity region having the first conductivity type and provided within the well;
   a second impurity region having the second conductivity type, provided inside the well and away from the first impurity region, wherein the second impurity region surrounds the first impurity region; and a third impurity region having a first conductivity type, wherein the third impurity region surrounds the well and is disposed away from the second impurity region;

wherein the well is formed to be deeper than the first impurity region, the second impurity region, and the third impurity region, in a thickness direction of the semiconductor substrate; and a minimum distance between the first impurity region and the second impurity region is smaller than a minimum distance between the second impurity region and the third impurity region.

2. The semiconductor device according to claim 1, wherein the first impurity region constitutes a body region of a lateral diffused metal oxide semiconductor (LDMOS).

3. The semiconductor device according to claim 1, wherein the first impurity region constitutes a drift region of an offset drain metal oxide semiconductor (MOS).

4. The semiconductor device according to claim 1, wherein at least part of a periphery of the second impurity region exists outside a perimeter of the well.

5. The semiconductor device according to claim 1, wherein:

the well is formed by a drive-in diffusion method; and the first, the second, and the third impurity regions are retrograde wells formed by a high-energy ion implantation method.

6. The semiconductor device according to claim 1, wherein an impurity concentration of the well is lower than that of the second impurity region.

* * * * *